(12) United States Patent
Kaiser et al.

(10) Patent No.: US 6,366,518 B1
(45) Date of Patent: Apr. 2, 2002

(54) CIRCUIT CONFIGURATION FOR PROGRAMMING AN ELECTRICALLY PROGRAMMABLE ELEMENT

(75) Inventors: Robert Kaiser, Kaufering; Florian Schamberger, Bad Reichenhall; Helmut Schneider, München, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/571,486

(22) Filed: May 15, 2000

(30) Foreign Application Priority Data

May 14, 1999 (DE) .......................... 199 22 360

(51) Int. Cl.$^7$ .............................................. G11C 7/00
(52) U.S. Cl. ..................................... 365/225.7; 365/200
(58) Field of Search ............................. 365/225.7, 200

(56) References Cited

U.S. PATENT DOCUMENTS

| | | | | |
|---|---|---|---|---|
| 5,563,832 A | * | 10/1996 | Kagami | 365/200 |
| 5,953,279 A | * | 9/1999 | Kim et al. | 365/225.7 |
| 6,097,645 A | * | 8/2000 | Penney et al. | 365/200 |
| 6,111,797 A | * | 8/2000 | Shirley | 365/200 |
| 6,240,034 B1 | * | 5/2001 | Sredanovic et al. | 365/225.7 |

FOREIGN PATENT DOCUMENTS

| | | |
|---|---|---|
| DE | 24 29 896 | 1/1975 |
| EP | 0 511 560 A2 | 11/1992 |

* cited by examiner

*Primary Examiner*—Huan Hoang
(74) *Attorney, Agent, or Firm*—Herbert L. Lerner; Laurence A. Greenberg; Werner H. Stemer

(57) ABSTRACT

A circuit includes a programmable element having conductor track resistance that can be permanently altered by an electric current. The circuit also has a switchable element for receiving a control signal for programming the programmable element. The programmable element and the switchable element are connected in series between two supply potentials. The programmable element can have an electrical fuse. The input of a read-out circuit is connected through a protective circuit to the circuit node between the programmable element and the switchable element. The protective circuit serves for limiting the voltage potential at the input of the read-out circuit during a programming operation. The circuit elements of the read-out circuit can thus be dimensioned in an area-saving manner. The protective circuit also can include a diode having an anode connected to the input of the read-out circuit and a cathode connected to a third supply potential. The protective circuit can include resistors, one disposed between the anode and input of the read-out circuit and another disposed between the anode and the circuit node.

4 Claims, 1 Drawing Sheet

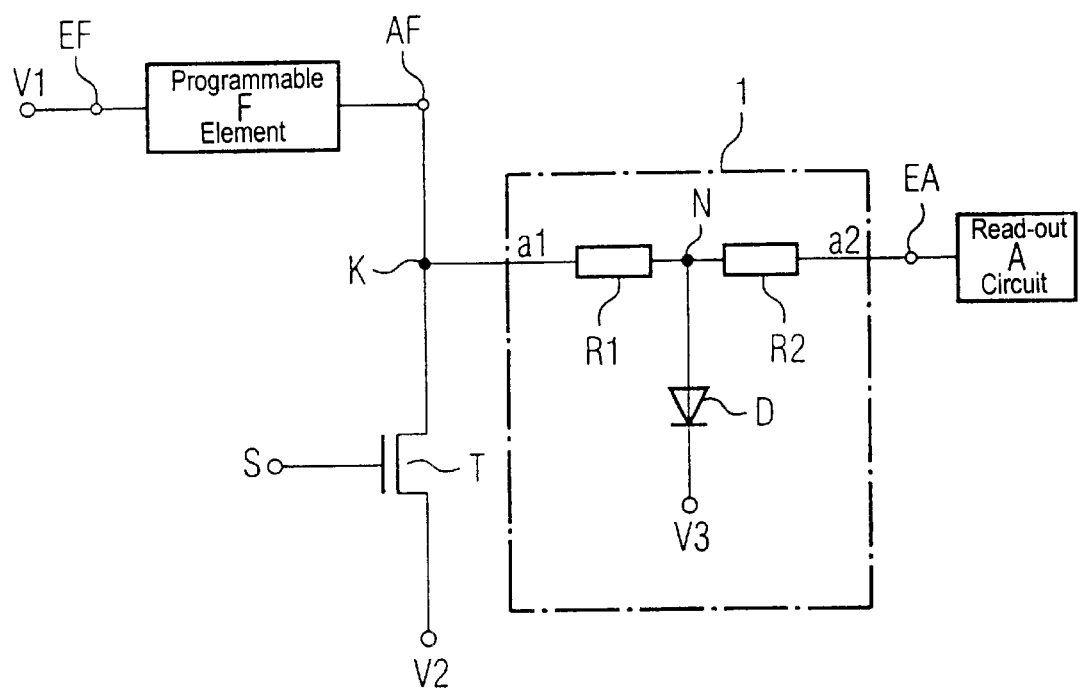

CIRCUIT CONFIGURATION FOR PROGRAMMING AN ELECTRICALLY PROGRAMMABLE ELEMENT

BACKGROUND OF THE INVENTION

Field of the Invention

The invention lies in the field of electronic circuits. The present invention relates to a circuit configuration having a circuit for programming an electrically programmable element and a read-out circuit connected thereto.

Integrated circuits often have redundancy circuits for repairing defective circuit sections. In the case of integrated memory circuits, in particular, these may be, for example, regular word or bit lines with defective memory cells that are replaced by redundant word or bit lines. To that end, the integrated memory is tested by a self-test device, for example, and programming of the redundant elements is subsequently performed in order to replace the regular elements. A redundancy circuit then has programmable elements, e.g., electrical fuses, store the address of a line to be replaced. Connected to the programmable elements are usually read-out circuits for reading out the respectively programmed state that contain, for example, volatile storage elements that, in connection with the fuses, are also referred to as fuse latches. The programmable elements can be programmed at the end of the process for fabricating the integrated circuit by applying a burning voltage.

For programming the electrically programmable elements, a burning voltage having a high potential level is applied to the circuit, usually externally. The operation for programming electrically programmable elements is effected by a high voltage or a high current, which leads to lasting alteration of the conductor track resistance, for example, by causing a corresponding electrical fuse to melt.

As a result of the burning voltage being present across a circuit for programming a programmable element, high potential differences occur across the circuit and, in some instances, across other circuits, such as the read-out circuit connected thereto. In order to withstand such a potential difference (which is considerably increased in comparison with other circuit sections of the integrated circuit), it is necessary for those circuit elements of the corresponding circuit that are at the increased voltage to be given larger dimensions than the circuit elements those that are only exposed to the normal operating voltage. With the application of recent technologies, it is possible that the affected circuit elements can no longer withstand the increased potential difference, regardless of the configuration.

To date, it has been customary for the circuit elements, particularly transistors, of the relevant circuit sections to be dimensioned such that they withstand the increased burning voltage without incurring damage as a result of the burning voltage. If a semiconductor chip has a multiplicity of electrically programmable elements, more space is required on the chip in order to accommodate the corresponding circuit configurations. A consequence of the increased space may be that, in the process of configuring an integrated circuit, the chip area has to be enlarged or the increased area requirement has to be reduced at another location. In the former case, an enlargement results in an increase in the fabrication complexity and the costs for fabricating the integrated semiconductor chip. In the latter case, the entire integrated circuit may exhibit a performance loss.

SUMMARY OF THE INVENTION

It is accordingly an object of the invention to provide a circuit configuration having a circuit for programming an electrically programmable element and a read-out circuit connected thereto that overcomes the hereinafore-mentioned disadvantages of the heretofore-known devices of this general type and that programs the programmable element with an increased voltage and dimensioning the circuit elements of the read-out circuit to save as much area as possible.

With the foregoing and other objects in view, there is provided, in accordance with the invention, a circuit configuration including a first supply terminal for receiving a first supply potential, a second supply terminal for receiving a second supply potential, a programmable element having a first terminal and a second terminal, the programmable element having a conductor track resistance between the first terminal, the first terminal connected to the first supply terminal, and the second terminal to be permanently altered by an electric current, a switchable element for receiving a control signal for programming the programmable element, the switchable element having a control terminal, a first terminal, and a second terminal, the first terminal of the switchable element connected to the second terminal of the programmable element, and the second terminal of the switchable element connected to the second supply terminal, a protective circuit having a first terminal and a second terminal, the first terminal of the protective circuit connected to the second terminal of the programmable element, and a read-out circuit having an input connected to the second terminal of the programmable element through the protective circuit, the second terminal of the protective circuit connected to the input of the read-out circuit for limiting a voltage at the second terminal of the protective circuit.

The circuit configuration according to the invention has a programmable element, whose conductor track resistance can be permanently altered by electric current, and also a switchable element, which has a control terminal for a control signal for programming the programmable element. The programmable element is connected, on one hand, to a terminal for a first supply potential and, on the other hand, to an input of a read-out circuit through a protective circuit and to a first terminal of the switchable element. A second terminal of the switchable element is connected to a terminal for a second supply potential. A protective circuit is connected between the output of the programmable element and the input of the read-out circuit for limiting the voltage at the input of the read-out circuit. The protective circuit ensures that, at the input of the read-out circuit, at most a maximum voltage value is present that is less than the value of the burning voltage. The maximum voltage assumes the value of the normal operating voltage, for example. Accordingly, during a programming operation, the circuit elements of the read-out circuit are not exposed to an increased potential difference by comparison to operation with normal operating voltage. Therefore, the circuit elements are not subject to a requirement of larger dimensioning in comparison with the circuit elements of the unaffected circuits. It is possible, therefore, to configure the read-out circuit together with the circuits with a minimum area outlay.

In accordance with another feature of the invention, there is provided a third supply terminal for receiving a third supply potential, the protective circuit having a diode with an anode and a cathode, the anode connected to the input of the read-out circuit and the cathode connected to the third supply terminal.

An advantageous embodiment of the circuit configuration provides a protective circuit containing a diode, whose anode is connected to the input of the read-out circuit and whose cathode is connected to a terminal for a third supply potential. As such, the third supply potential assumes the value of the positive operating voltage during normal operation, for example. The ESD-like structure has the advantage that charge carriers on the line connected to the diode are dissipated through the diode and immediate potential equalization can, thus, take place. Such dissipation and equalization allows effective protection of potentials that are larger than the third supply potential. On the other hand, proper normal operation of the circuit configuration is not adversely affected due to the blocking action of the diode with respect to smaller potential values at the input of the read-out circuit.

In accordance with a further feature of the invention, there are provided resistors, the anode being connected to the input of the read-out circuit through one of the resistors and the anode being connected to the second terminal of the programmable element through another of the resistors.

In a further refinement of the protective circuit, the anode of the diode is connected through a respective resistor to the input of the read-out circuit and to the programmable element. The resistor between the diode and the programmable element limits the maximum current through the diode during a programming operation. The configuration protects the diode from being destroyed. Both resistors together define the time constant (RC constant) for the input of the read-out circuit. In order to protect the read-out circuit effectively against overvoltage, the time constant must be greater than the time constant for the anode of the diode. It is required, however, for the resistors to be configured such that, during normal operation, the state of the programmable element can continue to be read out by the read-out circuit without restrictions.

In accordance with a concomitant feature of the invention, the programmable element has an electrical fuse.

A further advantageous effect of a protective circuit embodied with a diode is the protection of the read-out circuit with respect to a tunneling current of a programmable element embodied as an electrical fuse. For example, if the electrical fuse is in a high-impedance state, a current of charge carriers through the fuse nonetheless occurs, although to a small extent, which charge carriers surmount (tunnel through) an energy barrier that is present. The charge carriers of such a tunneling current are dissipated through the diode by the protective circuit. The above-described configuration of the protective circuit still permits the selection of an element to be programmed by way of the driving of the switchable element.

Other features that are considered as characteristic for the invention are set forth in the appended claims.

Although the invention is illustrated and described herein as embodied in a circuit configuration for programming an electrically programmable element, it is nevertheless not intended to be limited to the details shown because various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The figure is a circuit diagram having a circuit for programming an electrically programmable element and a read-out circuit connected thereto according to the invention.

DESCRIPTION OF THE PREFERRED EMBODIMENTS

Referring now to the single figure of the drawing, it is seen that a circuit configuration having a programmable element F with a first terminal EF and a second terminal AF, whose conductor track resistance between the first terminal EF and the second terminal AF can be permanently altered by an electric current. The circuit configuration furthermore contains a switchable element T having a control terminal S for receiving a programming control signal for programming the programmable element F. The switchable element T is preferably embodied as a transistor. Furthermore, the figure reveals a read-out circuit A with an input EA connected through the node K to the second terminal AF of the programmable element F. The first terminal EF of the programmable element F is connected to a terminal for a first supply potential V1. A first terminal of the switchable element T is connected to the second terminal AF of the programmable element F and a second terminal of the switchable element T is connected to the terminal for a second supply potential V2. The protective circuit 1 is connected by a first terminal a1 to the second terminal AF of the programmable element F, and by a second terminal a2 to the input EA of the read-out circuit A. The read-out circuit A serves for limiting the voltage at the second terminal a2 of the protective circuit 1 and, hence, at the input EA of the read-out circuit A.

In the embodiment, the protective circuit 1 contains a diode D. The diode D has an anode connected through a resistor R2 to the input EA of the read-out circuit A. The diode D also has a cathode connected to a terminal for a third supply potential V3. Further, the diode D is connected through a resistor R1 to the second terminal AF of the programmable element F.

The method of operation of the protective circuit 1 during a programming operation of the electrically programmable element F is explained below.

The electrically programmable element F is in a high-impedance state in the un-programmed state and in a low-impedance state in the programmed state. During a programming operation, for example, the potential V1 assumes the value of a positive burning voltage and the potential V2 the value of a reference-ground voltage. A programming operation of the programmable element F is initiated through the control input S of the switchable element T. The switchable element T is switched on and the burning voltage is applied, whereupon a high current flows through the programmable element F due to the potential difference between the terminals of the potentials V1 and V2. The programmable element F changes over to the low-impedance state, as a result of which, at the node K, the potential rises to the value of the burning voltage V1. However, the potential at the node N does not rise above the value of the potential V3, which corresponds for example to the normal positive operating voltage, plus the forward voltage of the diode D, which is relatively small in comparison with the voltages V1 to V3. Thus, the potential at the input EA of the read-out circuit A is protected against the burning voltage present at the node K.

If the programmable element F is not intended to be programmed, the control input S of the switchable element T is not driven. Therefore, the potential at the node K rises to a maximum voltage value summed from the value of the potential V3, the voltage drop across the resistor R1, and the forward voltage of the diode. The latter two voltages are governed, in particular, by the tunneling current through the high-impedance programmable element F. The voltage limiting at the node K is advantageous, in particular, when further circuit elements are also connected to the node K. The switchable element T in the form of a transistor is configured for the presence of the burning voltage. If the burning voltage is present at the terminal for the potential V1, the potential difference between the terminal for the potential V1 and the potential at the node K is insufficient for programming the programmable element F. Accordingly, as intended, the programmable element F is not programmed.

We claim:

1. A circuit configuration, comprising:

a first supply terminal for receiving a first supply potential;

a second supply terminal for receiving a second supply potential;

a programmable element having a first terminal and a second terminal, said programmable element having a conductor track resistance between said first terminal, said first terminal connected to said first supply terminal, and said second terminal to be permanently altered by an electric current;

a switchable element for receiving a control signal for programming said programmable element, said switchable element having a control terminal, a first terminal, and a second terminal, said first terminal of said switchable element connected to said second terminal of said programmable element, and said second terminal of said switchable element connected to said second supply terminal;

a protective circuit having a first terminal and a second terminal, said first terminal of said protective circuit connected to said second terminal of said programmable element; and a read-out circuit having an input connected to said second terminal of said programmable element through said protective circuit, said second terminal of said protective circuit connected to said input of said read-out circuit for limiting a voltage at said second terminal of said protective circuit below a programming voltage present at the circuit configuration for programming said programmable element.

2. The circuit configuration according to claim 1, including a third supply terminal for receiving a third supply potential, said protective circuit having a diode with an anode and a cathode, said anode connected to said input of said read-out circuit and said cathode connected to said third supply terminal.

3. The circuit configuration according to claim 2, including resistors, said anode connected to said input of said read-out circuit through one of said resistors and said anode connected to said second terminal of said programmable element through another of said resistors.

4. The circuit configuration according to claim 1, wherein said programmable element has an electrical fuse.

* * * * *